United States Patent [19]
Hayashi et al.

[11] Patent Number: 5,304,407
[45] Date of Patent: Apr. 19, 1994

[54] METHOD FOR DEPOSITING A FILM

[75] Inventors: Shigenori Hayashi, Kanagawa; Shunpei Yamazaki, Tokyo, both of Japan

[73] Assignee: Semiconductor Energy Laboratory Co., Ltd., Kanagawa, Japan

[21] Appl. No.: 22,759

[22] Filed: Feb. 22, 1993

Related U.S. Application Data

[63] Continuation of Ser. No. 803,217, Dec. 6, 1991, abandoned.

[30] Foreign Application Priority Data

Dec. 12, 1990 [JP] Japan ................................. 2-418075

[51] Int. Cl.$^5$ .............................................. B05D 3/06
[52] U.S. Cl. .................................... 427/569; 427/249; 427/255.2; 427/255.3; 427/255.5; 427/255.6; 427/571; 427/577; 427/578; 427/579; 427/598
[58] Field of Search ............... 427/569, 571, 577, 578, 427/579, 249, 255.3, 255.2, 255.5, 255.6, 598

[56] References Cited

U.S. PATENT DOCUMENTS 5,053,243 10/1991 Schuurmans et al. ................. 427/41
5,126,164 6/1992 Okazaki et al. .................. 427/579 X Primary Examiner—Bernard Pianalto
Attorney, Agent, or Firm—Sixbey, Friedman, Leedom & Ferguson

[57] ABSTRACT

An apparatus for depositing a film at atmospheric pressure and a method used for this formation are offered. Radicals are produced inside a space in which an electric discharge is induced. This space is shrouded in a purge gas to isolate the space from the outside air, for preventing the radicals traveling to the surface of a substrate from being affected by the outside air. A magnetic field and a bias voltage are made to act on the produced plasma, so that the radicals can reach the substrate surface with greater ease. The arriving radicals promote the formation of the film on the surface of the substrate.

21 Claims, 3 Drawing Sheets

METHOD FOR DEPOSITING A FILM

This application is a continuation of Ser. No. 07/803,217, filed Dec. 6, 1991, now abandoned.

BACKGROUND OF THE INVENTION

1. Field of the Invention

The present invention relates to a method and an apparatus for depositing a film substantially at atmospheric pressure. The invention is, therefore, capable of offering an inexpensive film formation apparatus which does not need any evacuating apparatus such as a vacuum pump. The film can be made from hard carbon, silicon nitride, silicon oxide, or other similar material. Films of this kind can be used to harden or improve the surface of plastic, glass, or organic photosensitive body or to prevent reflection at such surface. These films can find wide application. The invention is intended to provide a method and an apparatus for mass-producing these films at low costs.

2. Prior Art

Presently, coatings made of materials having unconventional functions such as hard carbons, silicon nitride, and silicon oxide are often formed by plasma chemical vapor deposition (PCVD). Most PCVD processes utilize reduced pressure. The main advantages of the use of reduced pressure are: (1) The effects of impurities contained in the atmosphere such as oxygen can be eliminated; (2) Where a plasma is employed, a stable glow discharge is obtained over a wide region; (3) Since the mean free path is long, the film thickness uniformity and the step coverage can be easily improved. However, an expensive evacuating apparatus and a vacuum vessel that is strong enough to withstand vacuum are needed to obtain reduced pressure (vacuum).

Generally, even a trace amount of impurity contamination is not tolerated in the field of semiconductor technologies since the coatings must have high performance. High depreciation costs of equipment can be easily assigned to commercial products having high added values. For these reasons, these coatings have been fabricated by plasma chemical vapor deposition as described above. On the other hand, where coatings are formed for hardening or improvement of surface of plastic, glass, or organic photosensitive body, or for prevention of reflection at such surface, very high purities are not required. Rather, increased costs due to the usage of expensive equipment present problems. That is, the best compromise must be struck between performance and cost.

Plasma CVD processes that need no evacuating apparatus are known. A plasma CVD which is applied to etching is described in Japanese Patent Application No. 286883 filed in 1990. In particular, a space is filled with a flowing gas consisting mainly of helium at a pressure close to atmospheric pressure. An AC electric field is applied to the space to ionize the gas and a halogenated etching gas added to it. In this way, excitons are produced and used for etching. Also, a technique making use of an electric discharge of a gas consisting mainly of helium for deposition of a thin film is known (the 2nd Volume of the Manuscripts for the 37th Japanese Applied Physics-Related Combined Lecture Meeting, 28p-ZH-10). However, in this technique, the reaction space is required to be replaced with a gas consisting mainly of helium and, therefore, the space must be once evacuated to a vacuum.

As described previously, the conventional coating formation process at reduced pressure is too expensive only for the hardening of the surface of plastic, glass, or organic photosensitive body or for formation of a coating. Therefore, more economical methods are being sought. A contemplated, economical coating formation method exploits an electric discharge at atmospheric pressure. This method yields the following advantages: (1) Since vacuum evacuation is not needed, an expensive evacuating system is not necessitated; (2) The time heretofore taken to evacuate the space can be omitted and so the processing time can be shortened; and (3) Since the coating is formed at high pressure, the collision time is short and the reaction rate is high, so that the processing time can be shortened. These can make the coating formation apparatus cheaper and shorten the processing time and hence contribute greatly to reductions in the costs of coating formation.

Formation of a coating at atmospheric pressure poses three problems. The first problem is contamination with atmospheric components. Specifically, ions, radicals, and other matter are produced in the space in which an electric discharge is induced. When they are being transported to the surface of the substrate on which the coating is formed, they react with impurities in the atmosphere, especially oxygen, thus affecting the coating. Since the surface on which a coating is being formed is active, the impurities adhering to the surface such as oxygen will deteriorate the performance of the coating.

The second problem is that the electric discharge space is limited to a narrow region. Generally, where a coating is formed on a substrate, it is required that the coating be created uniformly over a large area. For this purpose, a plasma must be generated over a wide area. Where an electric discharge is produced at atmospheric pressure, the mean free path of particles is as short as less than 1 $\mu$m. Therefore, recombination due to collision of electrons with ions in the space takes place frequently. Sometimes, the electric discharge region cannot be usually extended to over several millimeters.

The third problem is that the reaction rate is too high. In particular, ions and radicals collide with high probability and so reactions occur inside the space before the coating is grown on the substrate surface. As a result, they deposit as powder on the substrate.

SUMMARY OF THE INVENTION

It is an object of the present invention to provide a method for depositing a film free of the foregoing problems.

It is another object of the present invention to provide an apparatus for depositing an improved film substantially at atmospheric pressure.

In accordance with the present invention, a method for depositing a film comprises the steps of:

forming a reaction space which is substantially kept airtight by forming a shield gas flow intervening between said reaction space and atmosphere outside said reaction space;

introducing helium gas and a reaction gas material into said reaction space;

activating said reaction gas material by glow or corona discharge by the use of an electromagnetic energy in said reaction space; and depositing the activated material on a substrate.

The reaction gas material is activated directly by the electromagnetic energy. Alternatively, the helium gas is activated to an exciton by the electromagnetic energy and the reaction gas material is activated by an energy of said exciton.

In accordance with the present invention, an apparatus for depositing a film comprises:

a shield gas nozzle;

a reaction space which is substantially kept airtight during operation thereof by forming a shield gas flow intervening between said reaction space and atmosphere outside of said reaction space from said purge gas nozzle;

a central electrode provided in said reaction space;

a peripheral electrode provided around said central electrode;

an insulator provided between said central electrode and said peripheral electrode;

a first power source for supplying to said reaction space an electromagnetic energy required to maintain discharge in said reaction space; and a second power source for applying an electric field between said central electrode and a substrate to be coated in order to make a plasma ion in said reaction space attracted by said substrate.

It is preferred that the deposition of a film is carried out with the surface to be coated sputtered by a bias application. It is also preferred that a magnetic field is applied to the reaction space in such a way that various particles inside the resulting plasma are attracted toward the substrate. The particles may be rotated by the magnetic field.

The novel method for depositing a film is carried out substantially at atmospheric pressure to attain a cost reduction. This method is characterized in that it uses no evacuating apparatus. An electric discharge at atmospheric pressure must satisfy the three conditions: (1) The electric discharge space is permeated with helium; (2) An insulator is inserted in at least one location in the electric discharge path; and (3) The frequency of the power supply for exciting the electric discharge is in excess of tens of kilohertz.

Of these conditions, the gas of the condition (1) forming a gaseous environment, or an atmosphere, is of importance. The gaseous raw material of the film is added to this gas forming the atmosphere. The ratio of the raw material gas to the helium is 5% or less, preferably 1% or less. If the ratio is in excess of 5%, then the electric discharge is unstable. If the ratio exceeds 1%, then a large amount of powder is produced.

The raw material gas is selected according to the kind of the formed film. Where a hard carbon film is formed, the raw material gas is selected from hydrocarbon gases, such as methane, ethylene, acetylene, benzene, and methylbenzene, halogenated carbons, such as carbon tetrafluoride, carbon tetrachloride, fluorobenzene, and chlorobenzene, halogenated hydrocarbon gases, and alcohols, such as ethanol and methanol. In essence, any gas can be used as long as some degree of vapor pressure is produced at 1 atm. at room temperature. However, harmless gases such as methylbenzene, chlorobenzene, and ethanol are preferable to harmful materials such as acetylene and benzene, because the component of the raw material gas which has not reacted is expelled into the air. Since a molecule having more carbons tends to provide a higher reaction rate, ethylene is preferable to methane, and acetylene is preferable to ethylene. Aromatic compounds such as benzene are more preferable. Furthermore, the rate at which a film is formed is high where the raw material gas contains a halogen element, because a halogen element such as fluorine acts like a catalyst. In particular, the halogen element pulls out the hydrogen of a hydrocarbon molecule for example in the form of HF. Thus, the hydrocarbon molecule is easily activated. Halogen elements can be supplied as a molecule combined with carbon such as carbon tetrafluoride, carbon tetrachloride, fluorobenzene, and chlorobenzene, and also as any of nitrogen trifluoride, sulfur hexafluoride, tungsten hexafluoride, and fluorine gas. Where a gas containing a group III or V element such as nitrogen, boron, or phosphorus is added to the raw material gas, hard carbon films show slight electrical conductivity. This is effective in suppressing electrostatic electricity. For instance, if nitrogen trifluoride is added to a hydrocarbon gas such as ethylene or methylbenzene, a semi-insulative, i.e., electrostatic electricity-preventing, hard carbon films can be deposited at high rates. If hydrogen is added to the raw material gas, then dangling bonds in the hard carbon film are terminated by hydrogen. Also, sp and $sp^2$ bonds which have not reacted easily form $sp^3$ bonds by the action of hydrogen. Consequently, the hard carbon films become harder, and their transparency increases.

Where the formed film is made of silicon nitride, silane gas, disilane gas, and a nitrogen source such as nitrogen gas or ammonia gas can be used as the raw material gas. Where the formed film is made of silicon oxide, silane gas, disilane gas, oxygen, $N_2O$, or other gas can be used.

It is possible to add a rare gas such as helium, argon, or xenon, to the raw material gas to reduce the probability of collision with the presently reacting preform of the film, thus suppressing generation of powder. For the same purpose, hydrogen gas can be employed as a buffer gas.

The raw material gas selected as described above is adjusted to a pressure slightly higher than 1 atm. by a pressure governor. The gas is mixed with helium whose pressure is similarly adjusted. Then, the mixture gas is introduced into a reaction space substantially at atmospheric pressure, preferably 700 to 900 torr. One or more electrodes are provided in the reaction space. A shield (peripheral electrode) is disposed outside the electrodes. An insulator is mounted between the shield and the electrodes. An AC electric field of a frequency of 20 kHz or more is applied between the shield and each electrode to produce a plasma between each electrode and the shield with the insulator interposed between them. The plasma is generated by a glow discharge or corona discharge. The insulator and the frequency of 20 kHz or more are used to prevent arc discharge. If a large amount of electric power is supplied at a low frequency, then an arc discharge will occur. If an arc discharge takes place, the electrodes and the insulator will be damaged. Also, the electron temperature will drop. As a result, a normal coating will not be formed. One method of supplying electric power without shifting to an arc discharge is to increase the power supply frequency. This is identical in principle with supply of a large electric power to an RF corona. Specifically, a current of an RF power flows through the electrostatic capacitance of the space and an effective electric power in the RF power is consumed in a plasma which is equivalent to a resistor connected to the electrostatic capacitance of the space in series, as expressed in terms of an equivalent circuit. For instance, at a frequency of 13.56 MHz, an effective electric power of about 100 W can be stably supplied. At this time, the volume of the electric discharge space is about 20 mm$^3$. If the frequency is increased up to the microwave range, then the electric power will be supplied at higher efficiency. However, if the wavelength is as short as tens of centimeters to several centimeters, the power must be handled as electromagnetic waves. Therefore, contrivances are required for the waveguides and the electrodes. In this case, the electric discharge space itself must be regarded as a lossy waveguide, and the shape and the material must be so selected that the impedance is matched, for preventing reflection at every junction.

The electric power supplied for the electric discharge may be RF waves modulated with pulses or rectangular waves. If the duty cycle is 50% or less, then the plasma produced at the beginning of the electric discharge becomes different in nature with the plasma sustained by continuous electric discharge, because the effect of the afterglow is conspicuous. At the beginning of the electric discharge, the plasma has a high impedance and, therefore, a high voltage is applied to the space. (We are not sure whether it can be referred to as a plasma in the transient phase of the beginning of the electric discharge, but it is assumed that a plasma is started to be produced when a discharge current exceeding the dark current flows.) That is, the energy that each one electron inside the plasma possesses is large, and the electron temperature is high. At this time, the raw material gas existing inside the plasma space is efficiently excited. The plasma becomes an afterglow when the electric power subsequently ceases to be supplied. At this time, the external electric field applied to the space is no longer present; only an internal electric field exists in the space. This internal electric field also quickly disappears because of recombination of ions with electrons inside the afterglow. If a continuous electric discharge is produced, the electric field will be concentrated in minute protrusions on the surface of the substrate, thus causing selective growth of a film. This will result in pinholes or voids. On the other hand, during afterglow discharge, the electric field is not concentrated in the minute protrusions on the surface of the substrate and, therefore, a good film free of pinholes or voids is formed. That is, activated clusters, or the preform of a film, are allowed to adhere uniformly to the surface of the substrate by the use of radio-frequency waves modulated with pulses or rectangular waves. Hence, a good coating can be grown at a high speed. The pulse duration is preferably set equal to the time for which the afterglow persists, or on the order of several milliseconds.

The simplest form of the electric discharge space according to the invention is a cylinder. In particular, a cylindrical insulator is mounted between a grounded cylindrical peripheral (outer) electrode and a columnar central electrode disposed in the center of the space inside the peripheral electrode. The cylindrical insulator, the columnar central electrode and the cylindrical peripheral electrode may be arranged coaxially with one another. An AC electric field is applied between the central electrode and the peripheral electrode to produce a plasma in the gap between the insulator and the central electrode. This gap is 5 mm or less, preferably 1 mm or less. It could be said that this cylindrical structure resembles a point light source. If it is not moved, a dotted coating will be formed on the surface of a substrate. Therefore, in order to deposit a film uniformly over a wide region on the substrate, it is necessary to move the substrate or the film formation apparatus.

Where the substrate is a plane, a two-axis driver such as an XY table is used. If a further axis is added, i.e., an XYZ table, and if the system is controlled by a computer or the like, the coating can be shaped into any desired curved surface.

Other geometries include a straight form and a doughnut form. A straight electric discharge apparatus can be realized by an array of cylindrical apparatuses of the above-described structure. Alternatively, a gap of 5 mm or less, preferably 1 mm or less, may be formed in a straight electrode between an insulator and a grounded outer (peripheral) electrode. This gap is used as a straight electric discharge space. Where the substrate is a plane and a straight electric discharge apparatus is used, either the substrate or the film formation apparatus needs to be moved only along one axis. Where the substrate takes the form of a drum, a doughnut film formation apparatus may be advantageously used. This doughnut film formation apparatus can be fabricated by closing both ends of the aforementioned straight electric discharge apparatus.

Non-oxidizing gases can be used as a shield gas. Typical examples include nitrogen, argon, helium, and krypton. The used gas acts to isolate the electric discharge region from the constituents of the air, especially oxygen, for preventing the constituents of the air from entering the film formed by electric discharge. The shield gas is introduced in such a way that the electric discharge region is shrouded in this gas. As an example, in the case of formation of the above-described dotted coating, an outlet nozzle or port is disposed outside the peripheral (outer) electrode so as to surround it. A shield gas is admitted in such a manner that the electric discharge region is shrouded in the gas. At this time, the amount of the introduced purge gas is considerably larger than the electric discharge atmosphere gas. The shield gas should be supplied at a high pressure to prevent the shield gas itself from causing an electric discharge.

The generation of powder that is a problem with the prior art electric discharge at atmospheric pressure is due to excessive growth of clusters in air before they are conveyed to the surface of the substrate. To prevent this, any of various countermeasures must be taken. For example, the reaction rate in air is reduced. Ions, radicals, or clusters are transported positively to the surface of the coating. The reaction rate at the surface of the substrate is increased. For these purposes, the effects of a magnetic field are utilized, or a bias voltage is applied to the substrate.

In order to ensure that the active species produced by electric discharge at atmospheric pressure inside the plasma shrouded in the electric discharge atmosphere are conveyed to the substrate on which a film is formed, a bias electric field is applied to the substrate. Also, a magnetic field is applied to the plasma produced by the electric discharge. Various methods are available to apply a magnetic field to the plasma. For example, a conventional permanent magnet may be disposed on the rear surface of the substrate on which a film is formed, the substrate being located opposite to the electric discharge apparatus, or a solenoid coil is mounted near the electric discharge region produced by the electric discharge apparatus to apply a magnetic field thereto. A combination of these techniques is also possible. In any case, the direction of the magnetic field set up by a magnetic field-generating means is so selected as to ensure that the active species in the plasma of the electric discharge atmosphere gas produced by an electric discharge at normal pressure are conveyed to the substrate on which a film is formed. The key role of the magnetic field applied to the plasma is to bring radicals having spins, electrons, and ionized active species to the surface of the substrate on which a film is formed. As a result, the density of the active species around the substrate surface is enhanced. It is desired to make the strength of the magnetic field as high as possible. The strength is 200 gauss or more, preferably 500 gauss or more in the electric discharge region (reaction space).

One method of applying a bias electric field to the substrate is to apply a bias between the substrate and the electric discharge electrode by means of a DC or RF power supply. The active ions in the plasma are attracted toward the substrate by the bias electric field. The density of high energy ions is increased in the vicinities of the substrate. The raw material gas receives energy from these ions, thus increasing the density of the radicals near the substrate.

The bias electric field causes the ions to collide against the substrate. Energy is given to the substrate from the ions by the collision. The portion of the substrate which is quite close to its surface becomes hot to improve the adhesion of the coating (film) to the substrate. Also, the reaction occurring at the surface of the substrate to form a film is accelerated. That is, the ions moved to the substrate by the bias electric field function similarly to heating of the base. As the distance between the substrate and the electric discharge electrode varies, the effect of the electric field applied to the substrate changes greatly. Therefore, it is necessary to maintain the distance between the substrate and the electrode constant at all times. As a consequence, a distance-measuring instrument and a distance control mechanism are needed.

It is necessary that the frequency of the bias electric field be lower than the ion plasma frequency determined by the ion density inside the plasma. If this requirement is satisfied, the ions are oscillated by the bias electric field. The kinetic energy is transmitted to the substrate. Generally, the appropriate value of the frequency of the bias field is 1 MHz or less.

These techniques ensure that the radicals produced inside the space are transported to the surface of the substrate. Also, the reaction at the surface of the substrate is promoted. The result is that a dense film having little powder, i.e., free of pinholes, is deposited at a high rate.

Other objects and features of the invention will appear in the course of the description thereof which follows.

DETAILED DESCRIPTION OF THE PREFERRED EMBODIMENTS

EXAMPLE 1

Figure 1:
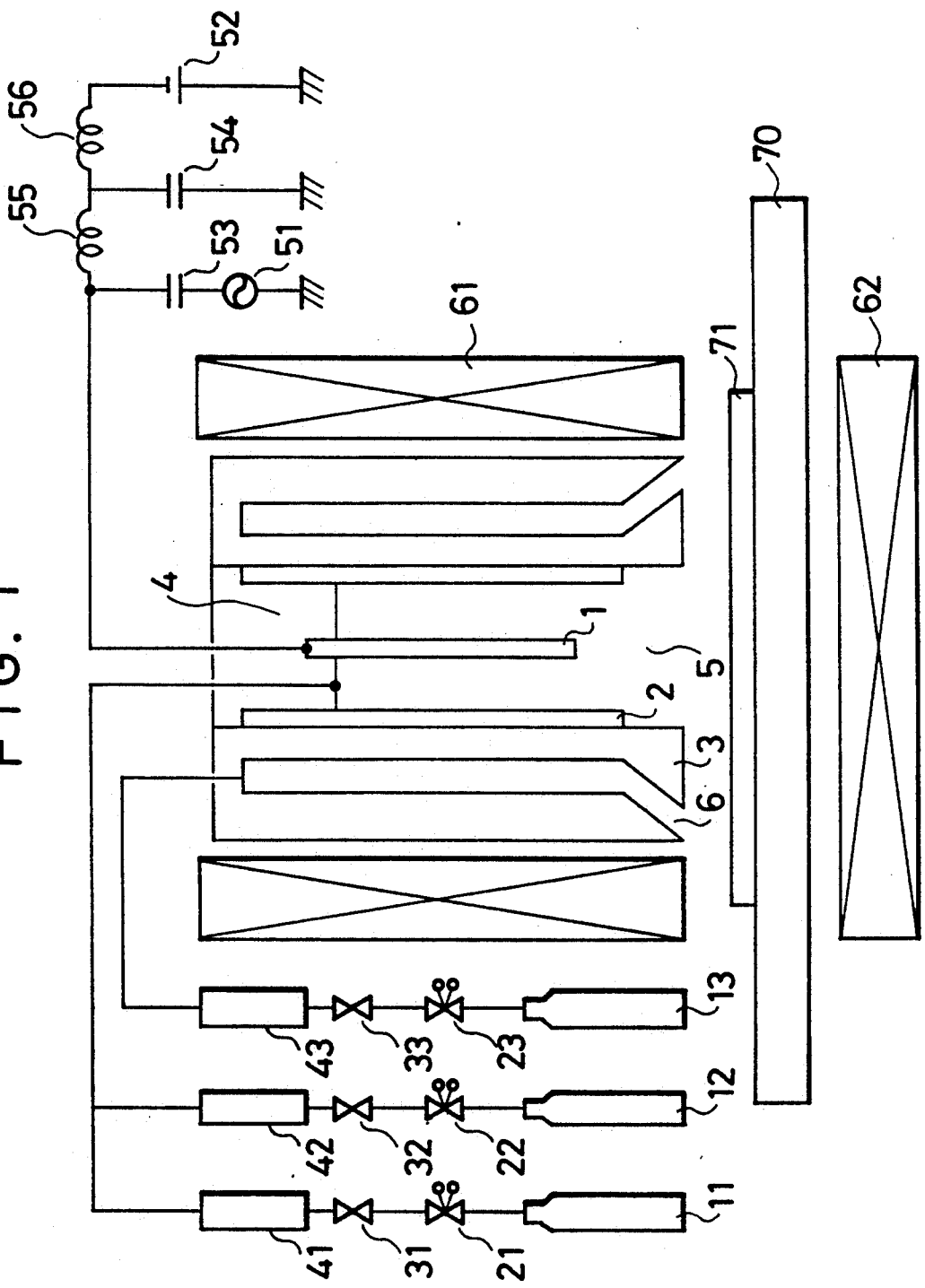
FIG. 1 is a cross-sectional view of a film formation apparatus having coaxial cylinders according to the invention, and in which gas and electrical systems are also shown.

Referring to FIG. 1, there is shown an apparatus for forming dots to produce a coating in accordance with the invention. Gas and electrical systems are also shown in FIG. 1. A cylindrical insulator 2 and a shield gas nozzle 3 are mounted coaxially with a columnar central conductor (electrode) 1, which is held to an insulating support 4. The central conductor 1 and the nozzle 3 are made of stainless steel. The insulator 2 is made of quartz glass. The insulating support 4 is made of Teflon. The shield gas nozzle 3 consists of two coaxial cylinders and has an eject port 6. A shield gas is introduced between the two cylinders of the nozzle 3 at about 1 atm. and ejected from the eject port 6. This eject port 6 is directed outward so that the gas may be emitted toward the outer circumference. An electric discharge takes place between the central conductor 1 and the cylindrical insulator 2 to produce radicals. The resulting radicals are conveyed toward a substrate 71 by the flow of the gas. The present invention is characterized in that a solenoid 61 and a permanent magnet 62 are mounted on the outer surface of the apparatus and on the back side of a substrate holder 70, respectively, to draw the radicals along the magnetic flux toward the substrate 71. The outside diameter of the central conductor 1 is 1 mm. The cylindrical insulator 2 has an inside diameter of 1.7 mm and an outside diameter of 2.5 mm. The space in which the electric discharge is produced is 20 mm long.

The substrate 71 is made of polycarbonate and place on the substrate holder 70 made of stainless steel that is a paramagnetic substance. The substrate 71 is not positively heated. The distance between the end of the electric discharge space and the surface of the substrate is 1 mm.

A raw material gas is supplied from a raw material gas bomb 11 via a pressure governor 21, a stop valve 31, and a flow controller 41. The pressure of the gas supplied from the bomb 11 is adjusted by the governor 21. The flow rate of the raw material gas is controlled by the flow controller 41. Similarly, helium gas is supplied from a helium gas bomb 12 via a pressure governor 22, a stop valve 32, and a flow controller 42. The pressure of the helium gas supplied from the bomb 12 is adjusted by the governor 22. The flow rate of the helium gas is controlled by the flow controller 42. The raw material gas and the helium gas are mixed and supplied into the electric discharge space. The raw material bomb 11 is filled with 10% methane gas balanced with hydrogen gas. Ninety nine (99) parts of the helium gas and 1 part of the raw material gas are mixed. The total flow of the mixture gas is 100 sccm.

Electric power, e.g. alternating voltage, is supplied to the central conductor 1 from a high frequency (radio-frequency) power supply 51 via a blocking capacitor 53. The power supply frequency is 13.56 MHz. The effective electric power supplied is 20 W. In one feature of the invention, a bias voltage is applied from a bias power supply 52 via a first high frequency (radio-frequency) stopping coil 55 and a second high frequency (radio-frequency) stopping coil 56. The high frequency (RF) electric power transmitted through the first coil 55 is permitted to escape by a bypass capacitor 54. As a result, the bias power supply 52 is protected. In the present example, the applied bias voltage is DC voltage. The voltage is −100 V with respect to the substrate holder.

A shield gas is supplied into the shield gas nozzle from a bomb 13 via a pressure governor 23, a stop valve 33, and a flow controller 43. The pressure of the gas supplied from the bomb 13 is adjusted by the governor 23. The flow rate of the shield gas supplied into the shield gas nozzle is controlled by the flow controller 43. In the present example, nitrogen is used as the shield gas. The flow rate is 1000 sccm.

A hard carbon film was formed on a substrate made of polycarbonate with the above-described apparatus by the method described above. Although the film was grown at a very high rate that was 0.2 μm/min. just under the opening of the electric discharge region, little powder was produced. The film was good in quality, since only a small amount of pinholes existed. The hardness measured with a microhardness tester was about 3000 kgf/mm$^2$. The measured spectral transmittance in the visible range was in excess of 90%, i.e., almost transparent. Measurements using FT-IR (Fourier-transform infrared spectrometry) and Raman spectroscopy have shown that the ratio of sp$^3$ bond to sp$^2$ bond was 1.6:1, which is close to the ratio of the bonds in diamond.

In the present example, the film formation apparatus was not moved. Obviously, a uniform film can be formed on a substrate surface having a large area by scanning the surface at a constant speed.

COMPARATIVE EXAMPLE 1

The present example was similar to Example 1 except that no magnetic field was developed. The hardness and the transmittance of the film formed by this method were almost identical to those of Example 1, but the deposition rate was lower slightly. Also, much powder was observed.

COMPARATIVE EXAMPLE 2

The present example was similar to Example 1 except that no bias voltage was applied. The film formed by this method had a lower hardness and a higher transmittance than the film of Example 1. Much powder was observed in the same way as in Comparative Example 1. The deposition rate was not different.

COMPARATIVE EXAMPLE 3

The present example was similar to Example 1 except that no shield gas was used. Only a slight amount of coating was formed just under the opening of the electric discharge region by this method. The deposition rate decreased by a factor of approximately ten. We consider that this decrease is due to etching of the portion of the coating which is close to the outer fringe, the etching being allowed by addition of oxygen. Neither the hardness nor the transmittance changed.

EXAMPLE 2

Figure 2:
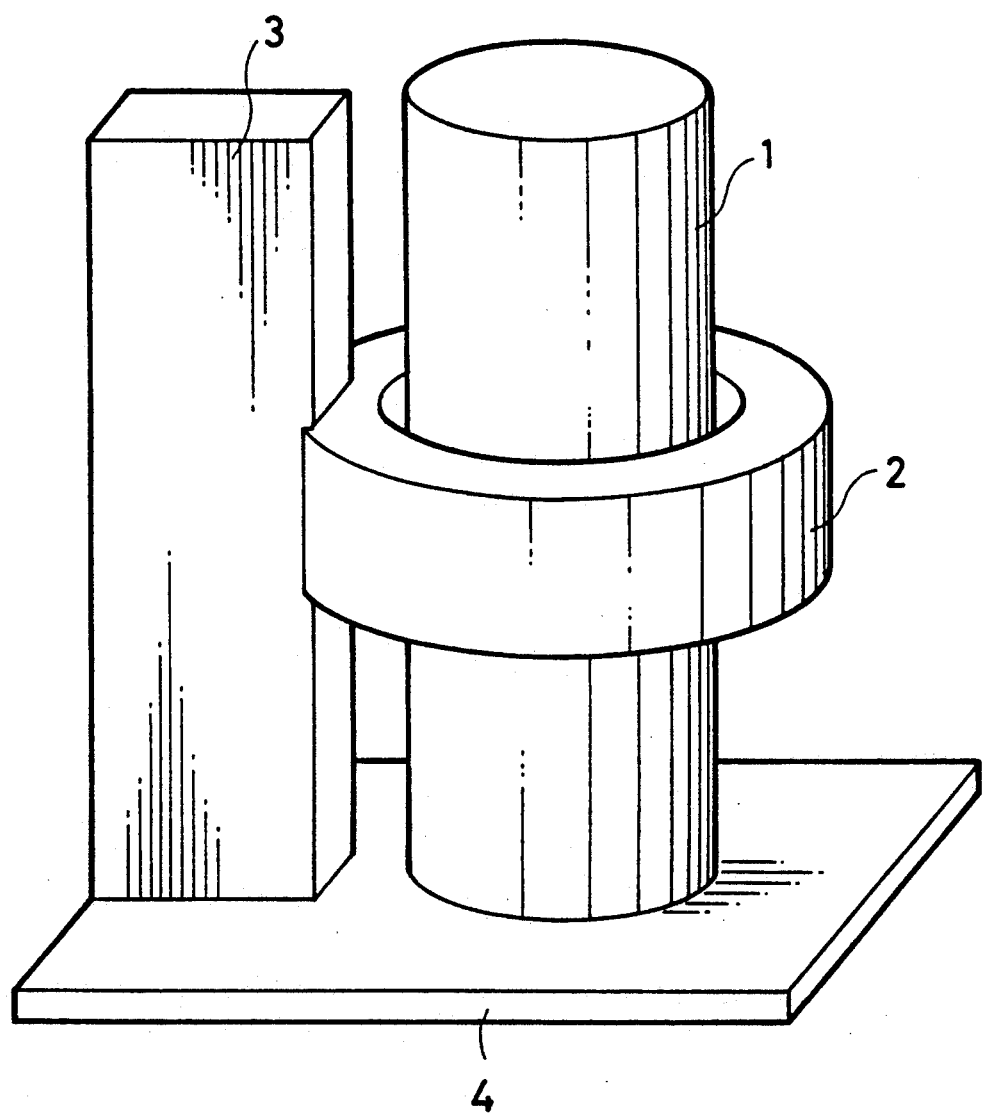
FIG. 2 is a perspective view of an apparatus for depositing a film on a cylindrical substrate, the apparatus being fabricated in accordance with the invention.
Figure 3:
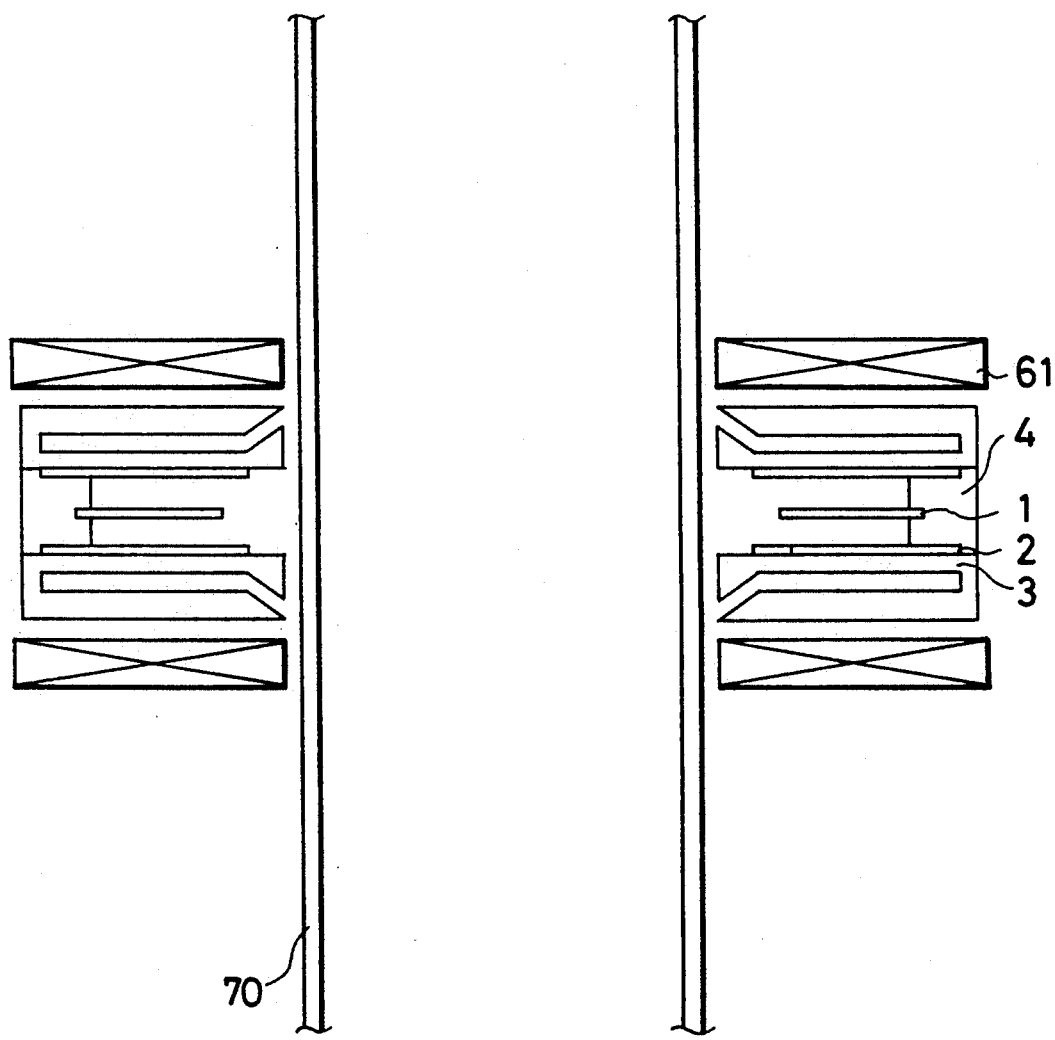
FIG. 3 is a cross-sectional view of the electric discharge portion of the apparatus shown in FIG. 2.

This example is intended to form a hard carbon film on a cylindrical substrate. The appearance of the used apparatus is shown in FIG. 2. The apparatus comprises a frame 4, an elevating mechanism 3 mounted to the frame 4, and a film formation apparatus 2 held to the elevating mechanism 3. A cylindrical substrate 1 is disposed inside the film formation apparatus 2. The electric discharge opening inside the film formation apparatus faces inward to form a film on the surface of the substrate. The elevating mechanism 3 moves vertically at a uniform velocity corresponding to the deposition rate. The substrate and the film formation apparatus are shown in FIG. 3 in cross section. The apparatus has an electric discharge electrode 1, an insulator 2, a shield nozzle 3, and an electrode support 4. That is, the apparatus is essentially identical with the apparatus of Example 1. Produced radicals are conveyed to the surface of a substrate 70 by a magnet 61. The ratio of the raw material gas to the helium gas, the flow rate of the mixture gas, the power supply frequency, and the bias voltage were the same as those of Example 1. The electric power supplied was 2 W/mm. Where the circumference was 40 mm, the electric power was 80 W. The characteristics of the obtained film such as the hardness, the transmittance, the ratio of the sp$^3$ bond to the sp$^2$ bond, and the deposition rate, were almost identical with those obtained in Example 1. No powder was observed.

As described above, in accordance with the present invention, a gas consisting mainly of helium is caused to produce an electric discharge at atmospheric pressure. A gaseous raw material is added to the gas. Where a hard carbon film is formed, the raw material is methane, hydrogen, or other substance. The electric discharge is shrouded in nitrogen gas or other shield gas. A magnetic field and a bias voltage are applied. A coating of high quality can be deposited at a high rate without producing powder.

What is claimed is:

1. A method for depositing a film comprising the steps of:
    forming a reaction space by flowing a shield gas intervening between said reaction space and atmosphere outside said reaction space;
    introducing carrier gas and a reactive gas into said reaction space;
    activating said reactive gas by glow or corona discharge by the use of an electromagnetic energy in said reaction space; and
    depositing the activated material on a substrate.

2. The method of claim 1 wherein said reactive gas is activated directly by said electromagnetic energy.

3. The method of claim 1 wherein said carrier gas ia activated to an exciton by said electromagnetic energy and said reactive gas is activated by an energy of said exciton.

4. The method of claim 1 wherein said shield gas flow is formed toward said substrate in order that said substrate is in contact with said reaction space and serves to keep said reaction space substantially airtight together with said shield gas flow.

5. The method of claim 1 wherein the introduction of said carrier gas and said reactive gas is carried out substantially at atmospheric pressure in terms of total pressure thereof in said reaction space.

6. The method of claim 1 wherein a magnetic field is applied to said reaction space in order to rotate said material thereby.

7. The method of claim 6 wherein said magnetic field is 200 Gauss or more in said reaction space.

8. The method of claim 1 wherein a halogen containing gas is further introduced into said reaction space as catalyst during said introducing step in case of carbon film formation.

9. The method of claim 1 wherein a gas selected from the group consisting of helium, argon, xenon and hydrogen is further introduced into said reaction space during said introducing step in order to suppress generation of powder.

10. The method of claim 1 wherein said reactive gas comprises a hydrocarbon gas.

11. The method of claim 1 wherein a central columnar electrode is provided in said reaction space and a grounded peripheral cylindrical electrode is provided around said central electrode and a cylindrical insulator is provided therebetween and coaxial with said central electrode and said peripheral electrode and said electromagnetic energy is supplied to said reaction space by applying an alternating voltage to said central electrode.

12. The method of claim 11 wherein frequency of said alternating voltage is 20 KHz or more.

13. The method of claim 1 wherein a shield gas of said shield gas flow is an inactive gas selected from the group consisting of nitrogen, argon and helium.

14. The method of claim 1 wherein the introduction of said carrier gas and said reactive gas is carried out at a pressure of 700 to 900 torr in terms of total pressure thereof in said space.

15. The method of claim 1 wherein said reaction space is substantially kept airtight.

16. The method of claim 1 wherein said carrier gas is helium.

17. A plasma processing method comprising the steps of:
preparing a central columnar electrode and an outer electrode around said central columnar electrode in a coaxial relation such that a discharge space is formed therebetween;
placing a dielectric member between said central columnar electrode and said outer electrode;
introducing a reactive gas from one end of said discharge space;
applying a high frequency voltage between said central columnar electrode and said outer electrode to form a plasma of said reactive gas;
directing said plasma to a surface of an object through another end of said discharge space in order to treat said surface with said plasma,
flowing a shield gas to prevent said plasma from directly contacting the air.

18. The method of claim 17 wherein said shield gas is applied from a nozzle surrounding said outer electrode.

19. The method of claim 17 wherein said high frequency voltage is pulsed.

20. The method of claim 17 further comprising the step of applying bias voltage to said central electrode.

21. The method of claim 17 further comprising applying a magnetic field to said plasma.

* * * * *